United States Patent [19]

Parker

[11] 4,182,986
[45] Jan. 8, 1980

[54] TEST, CONTROL AND GAUGING METHOD USING LOCKED OSCILLATORS

[76] Inventor: Edward I. Parker, 34 Oak Ridge Rd., Holden, Mass. 01520

[21] Appl. No.: 932,927

[22] Filed: Aug. 11, 1978

Related U.S. Application Data

[63] Continuation of Ser. No. 734,524, Oct. 21, 1976, abandoned, which is a continuation-in-part of Ser. No. 571,949, Apr. 28, 1975, Pat. No. 3,987,649, which is a continuation-in-part of Ser. No. 447,965, Mar. 4, 1974, abandoned, which is a continuation-in-part of Ser. No. 360,636, May 16, 1973, Pat. No. 3,910,074.

[51] Int. Cl.² ............................................. G01R 33/12
[52] U.S. Cl. ......................................... 324/236; 331/65
[58] Field of Search ......................... 324/82, 207, 236; 331/65

[56] References Cited

U.S. PATENT DOCUMENTS 3,222,664  12/1965  Premack ................................ 324/82

FOREIGN PATENT DOCUMENTS 597705  2/1948  United Kingdom ...................... 324/236

Primary Examiner—Robert J. Corcoran
Attorney, Agent, or Firm—Charles E. Pfund

[57] ABSTRACT

A pair of similar oscillators are coupled to each other such that when their natural resonant frequencies are close together they lock in and operate as synchronized oscillators over a predetermined range which can be selected by control of circuit parameters. Within the range where the oscillators are locked to be equal in frequency the phase angle between the frequency generated in each oscillator can be used as a measure of the influence on the resonant frequency of one oscillator relative to the other and where this influence is due to the parameters of an external test piece or the like influencing one oscillator, the measurement of phase angle is a measurement of a characteristic or parameter of the test piece. Accordingly, a go, no-go gauge can be operated by detecting phase differences of a predetermined magnitude using a threshold circuit or a direct indication of the phase angle can be calibrated in terms of some deviation in standard dimension or other feature of the test piece which influences the resonant frequency of one of the oscillators sufficiently to cause the synchronism between the two oscillators to be lost, each oscillator will operate at its own resonant frequency and this frequency difference can be detected to indicate that the test piece has deviated by more than a predetermined amount necessary to cause loss of synchronization. Various arrangements permit operation with static or dynamic parts which are either discrete pieces or continuous sheet bar or wire stick and the like.

1 Claim, 13 Drawing Figures

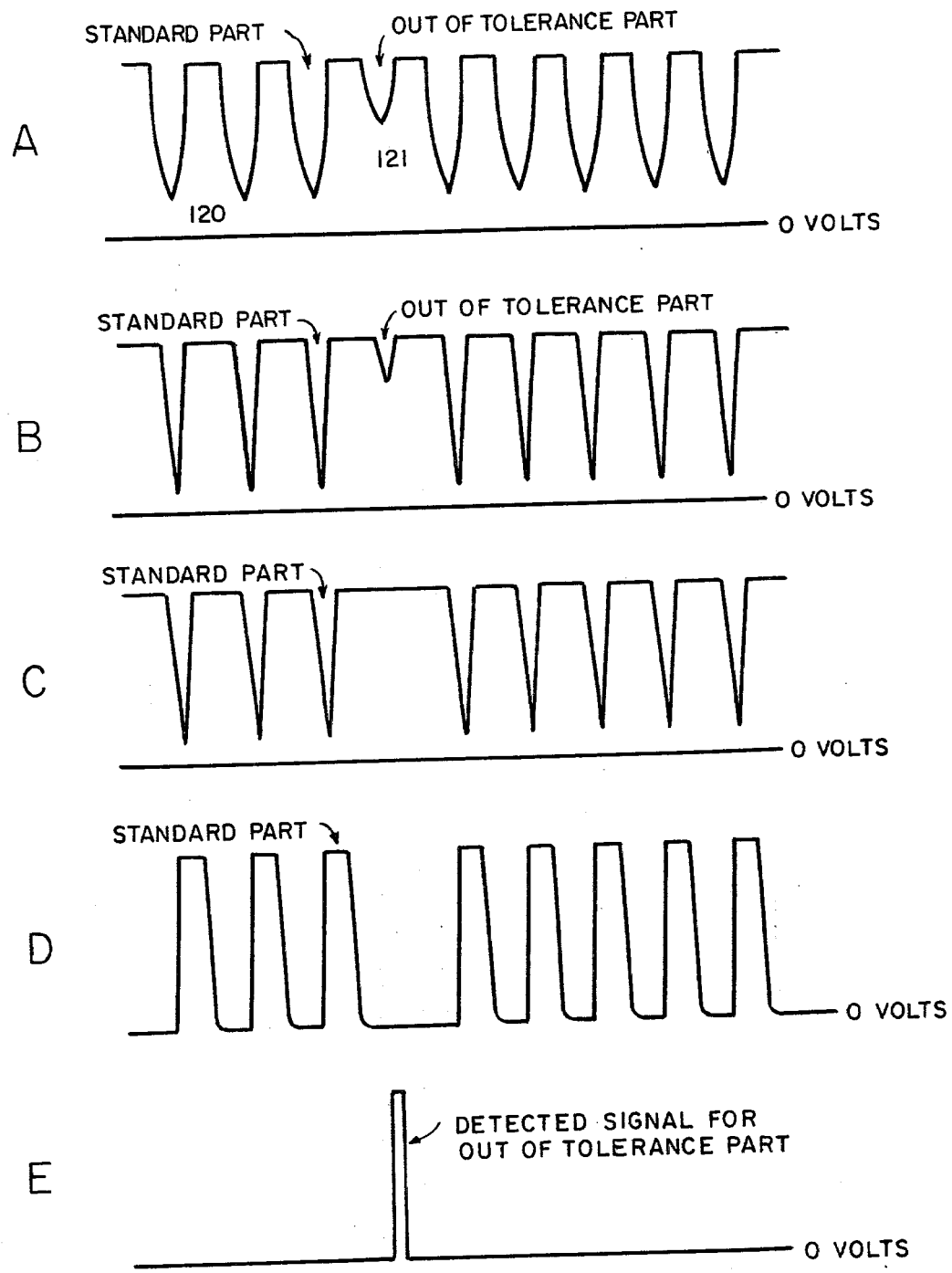
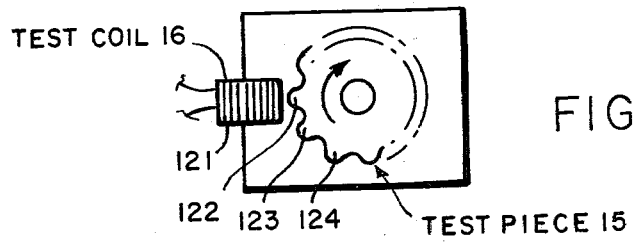
FIG.12
FIG.11

TEST, CONTROL AND GAUGING METHOD USING LOCKED OSCILLATORS

CROSS REFERENCE TO RELATED APPLICATION

This application is a continuation of U.S. Ser. No. 734,524, filed Oct. 21, 1976, now abandoned in favor of the instant application, which was a continuation-in-part of U.S. Ser. No. 571,949, filed April 28, 1975, now U.S. Pat. No. 3,987,649, issued Oct. 26, 1976 which is a continuation-in-part of U.S. Ser. No. 447,965, filed on Mar. 4, 1974, now abandoned which is a continuation-in-part of U.S. Ser. No. 360,636, filed May 16, 1973, now U.S. Pat. No. 3,910,074, issued Oct. 7, 1975.

BACKGROUND OF THE INVENTION

Various forms of conductive or dielectric material gauges have been provided in the prior art in which a work piece is used to influence the reactance of a coil or capacitance to alter the circuit parameters of a resonant circuit or bridge with the electrical changes caused by this influence measured as an indication of some parameter or characteristic of the part. These prior art circuits have included the use of two oscillators with the measurement made with respect to the beat frequency therebetween which varies aas the resonant frequency of one or the other of the oscillators is influenced by the presence of a test part. While these prior art guages have been useful in certain applications there remains a need for a guaging circuit in which a wide range of measurement can be made with selected sensitivity, particularly in being able to provide a stable system in which minute deviations among tested work pieces can be detected. It is particularly desirable that such measurements be accomplished with ease by unskilled personnel working in a manufacturing or production environment where stability and reliability under relatively adverse operating conditions are of paramount importance.

SUMMARY OF THE INVENTION

The present invention relates to electrical gauging systems for conductive parts or any parts or materials which can be used to influence the inherent resonant frequency of electrical circuits and the constituent parts thereof such as inductors and capacitors. By utilizing similar oscillators which incorporate such electrical components as their frequency determining circuit elements and coupling the two oscillators to a selectable degree, a selected range of synchronized operations can be achieved. Synchronization between the two oscillators is utilized to measure the phase difference between the synchronized oscillators as a direct measure of the parameter of the work piece which is influencing the resonant frequency of one oscillator relative to the other. Thus a threshold is established representing measurement of the parameter deviation relative to the locked-in region of the two oscillators and this parameter can be accurately measured within the locked-in range in direct relation to the phase difference which it introduces relative to a preadjusted phase condition between the locked oscillators. By adjusting the coupling by which the oscillators influence each other the range for lock-in can be selcted and the sensitivity of the phase measurement within the lock-in range adjusted to provide any desired resolution in the measurement of the characteristic of the test piece.

BRIEF DESCRIPTION OF THE DRAWINGS

FIG. 11 is a perspective view of a probe-type test coil arranged to test a property of successive test pieces such as the teeth on a gear wheel.

FIG. 12 is a waveform diagram useful in describing the operation of the circuit of FIG. 5 when employed for the type of test illustrated in FIG. 11.

DETAILED DESCRIPTION OF THE PREFERRED EMBODIMENT

Figure 1:
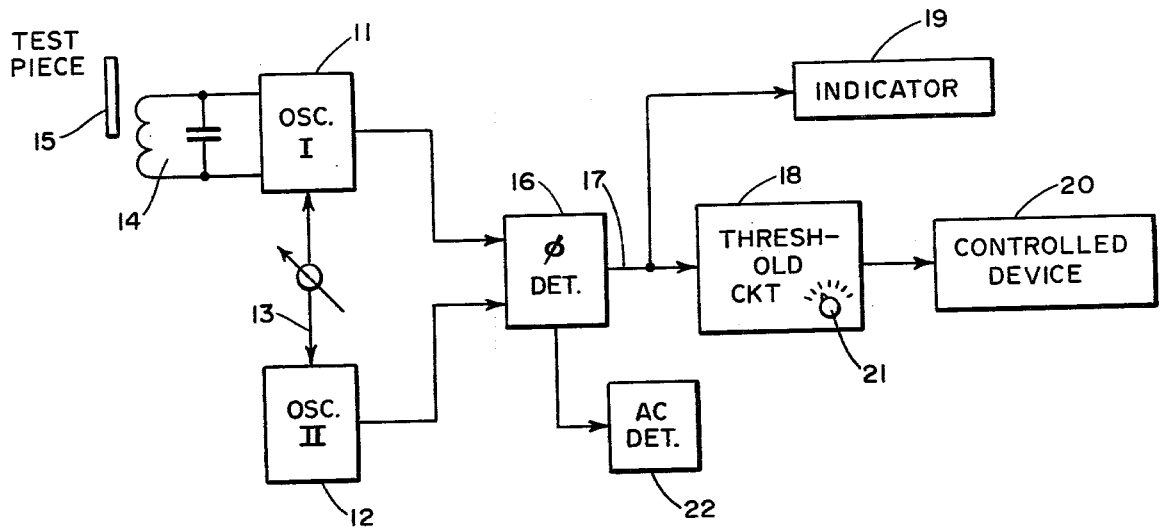
FIG. 1 is a block diagram of a system in accordance with the present invention.

In FIG. 1, two oscillators 11 and 12 are shown with a coupling connection 13 therebetween indicated. When energy from one oscillator is coupled into the resonance influencing or determining portion of the circuit of another oscillator, the oscillations of both oscillators are influenced and under certain conditions the oscillators can become synchronized or "locked-in". The general description of oscillators under these conditions has been described by Huntoon and Weiss in an article entitled "Synchronization of Oscillators" published in the *Proceedings of the I.R.E.* for December, 1947, pp 1415-1423. In FIG. 1, oscillator 11 is indicated as having a tuned circuit 14 as a representative of the primary frequency determining elements for the oscillator 11. Adjacent the inductance test coil 16 indicated in tuned circuit 14 is shown a test piece 15 which may represent a work piece or any other external entity which exhibits a phenomenon which can be reflected into the circuit 14 as an electrical impedance change and thus influence the natural resonant frequency of the oscillator 11. Typically, the test piece 15 could be a metal part introduced within a coil 16 specially configured to accept the presence of the piece 15 or the continuous movement of piece 15 into and out of inductance-altering relation to the inductor portion of the tuned circuit 14. Obviously, other circuit elements could be altered including the oscillator resistance or the resonant circuit capacitance, for example by the introduction of a dielectric test piece to alter the capacitance value as a function of dielectric constant or thickness changes and thus any such use of an external entity to influence the resonant frequency of the oscillator 11 is intended to be represented by the highly schematic showing in FIG. 1.

As indicated in FIG. 1, a mutual coupling 13 exists between the oscillators 11 and 12 which couples or injects an oscillating voltage or current from each oscillator into the other. Depending upon the undisturbed resonant frequencies of the respective oscillators 11 and 12 and the amount of coupling therebetween, it is possible to describe the operation of the oscillators for various conditions as shown by Huntoon et al. If the frequency of oscillation for oscillators 11 and 12 is approximately the same a slight amount of coupling provided by mutual coupling 13 will cause the oscillators to synchronize and operate at the same frequency. The greater the degree of mutual coupling 13, the wider the bandwidth for synchronization or lock-in, and thus by providing a variable mutual coupling 13, the lock-in bandwidth can be selected to provide a desired range of operation over which the oscillators 11 and 12 are synchronized.

When the oscillators 11 and 12 are naturally operating at the same frequency, only the slightest degree of mutual coupling 13 is required to bring them into synchronization and for such conditions the oscillators operate with zero phase shift therebetween. As the resonant frequency control for one of the oscillators changes, such as that produced by the influence of test piece 15 on the resonant circuit 14 of oscillator 11, the phase between the oscillations from oscillators 11 and 12 will differ from zero and over the lock-in region the phase between the two oscillators can vary from $-90°$ to $+90°$. Thus the phase difference between the two oscillators can be measured by a phase detector 10 as a measure of the external influence on resonant circuit 14 caused by test piece 15. The phase detector 10 can provide an output 17 which represents the magnitude of the phase angle detected and the signal on line 17 can be utilized in any manner as a measure of the characteristics of the test piece 15. An indicator 19 is connected to the output of the phase detector 10 to indicate a quantity related to phase angle. As shown in FIG. 1, a threshold circuit 18 is also coupled to the phase detector 10 and its output operates a relay or other controlled device 20. Thus by adjusting the threshold of the circuit 18 by means of an adjustment 21 the system can be utilized to produce an actuation whenever the test piece 15 has a characteristic which influences resonant circuit 14 that is outside a predetermined tolerance or desired value. When the influence is so far beyond the range of values that produce lock-in between the oscillators 11 and 12 the condition of lack of synchronization or loss of lock-in can be indicated by a detector 22 which senses a frequency difference condition existing on the inputs to phase detector 16 from the oscillators 11 and 12.

Figure 2A:
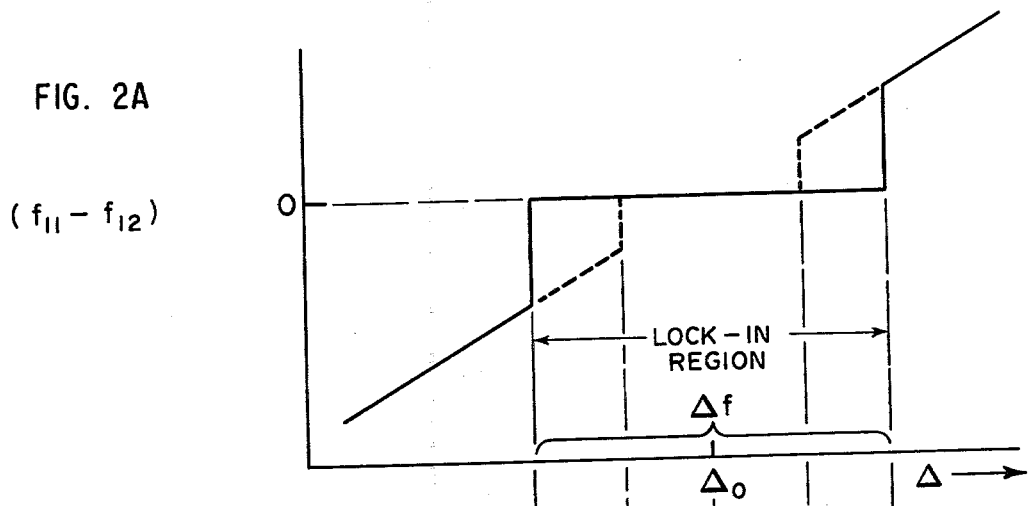
FIG. 2A is a diagram indicating frequency difference between the oscillators shown in FIG. 1 as a function of a variation of the circuit parameter.
Figure 2B:
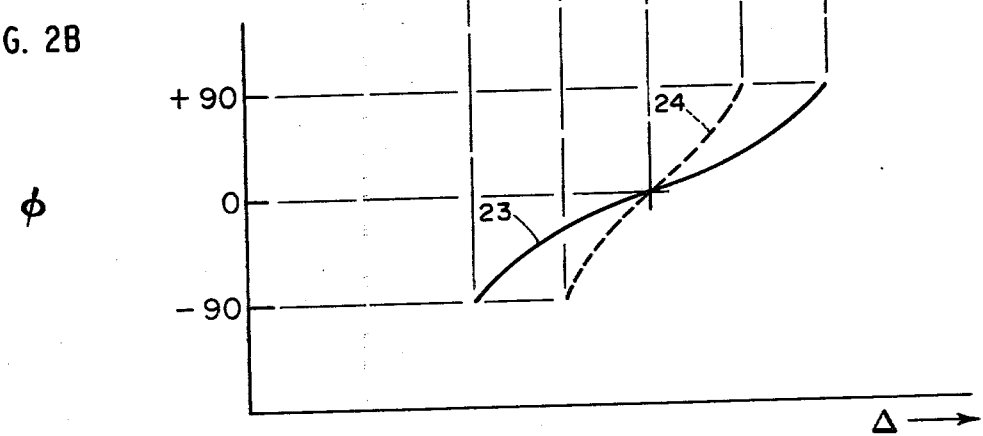
FIG. 2B is a diagram showing variation of phase during the locked-in interval shown in FIG. 2A.

The foregoing conditions can be described with reference to FIGS. 2A and 2B. In FIG. 2A the frequency difference $f_{11}-f_{12}$ is plotted versus some parameter $\Delta$ which represents a parameter affecting the natural resonant frequency for oscillation of the oscillator 11. As shown by the solid curve for values of $\Delta$ which are remote from a nominal or center value $\Delta_o$ the difference in the frequencies of the two oscillators corresponds with their undisturbed values. In the lock-in region indicated in FIG. 2A the frequency difference is zero and the bandwidth of lock-in $\Delta f$ is determined by the characteristics of the oscillators 11 and 12 and the degree of mutual coupling 13. As shown in FIG. 2B within the lock-in region a phase variation characteristic 23 relates phase angle to the parameter $\Delta$ and thus can be used as a direct measure thereof. By varying the mutual coupling 13 the bandwidth of lock-in can be varied as indicated by the dotted characteristic in FIG. 2A and the corresponding phase characteristic 24 shown dotted in FIG. 2B will provide a measure of the parameter $\Delta$ with increased sensitivity with respect to the phase characteristic 23.

Figure 3:
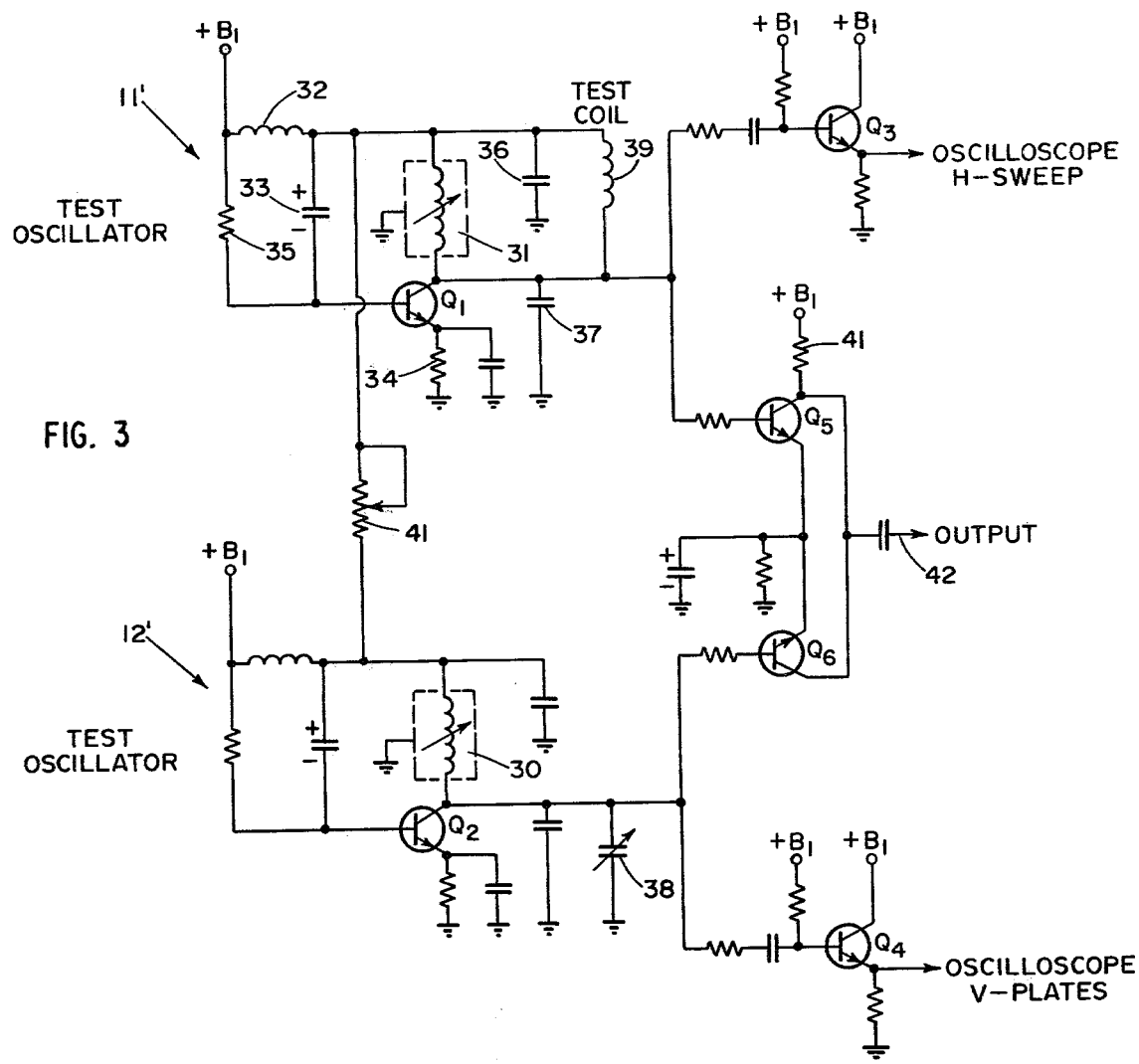
FIG. 3 is a schematic wiring diagram of one embodiment of the invention showing coupled oscillators and a phase detector.

Referring now to FIG. 3 a detailed arrangement in accordance with the system of FIG. 1 will be described. A test oscillator 11′ and a control oscillator 12′ generally correspond to the oscillators 11 and 12 of FIG. 1. Taking oscillator 11′ the circuit comprises a transistor $Q_1$ the collector of which is connected to positive potential source $+B_1$ through a variable inductor 31 in series with a choke coil 32. The junction between the two inductors 31, 32 is coupled by means of a capacitor 33 to the base of transistor $Q_1$. The emitter is connected to ground through a bypassed resistor 34 and the base is maintained at a biased operating point by connection through a relatively large resistor 35 to the positive supply. The resonant circuit is formed with the inductor 31 and capacitors 36 and 37. The oscillator 11′ just described is substantially duplicated for the oscillator 12′ except that the oscillator 12′ has a fine tuning variable capacitance 38 connected in parallel with the capacitor corresponding to 37. The oscillator 11′ in addition has a test coil 16 connected at terminals 40 and thus forming part of the tuned circuit. This test coil 16 may be adapted to receive the test piece 15 or otherwise be influenced by the characteristics or the quantity which it is desired to measure.

The junction between the inductors 31 and 32 is coupled through an adjustable resistor 41 to a coresponding point on the oscillator 12′. This connection forms the mutual coupling between the oscillators 11′ and 12′ described as element 13 in FIG. 1 and serves to inject into the tuned circuit of each oscillator an AC signal corresponding to the oscillations generated in the other. This mutual coupling can be resistive, capacitive or inductive and need not be arranged to connect exactly the same spots in the circuit configuration of the two oscillators. Any general form of mutual coupling which reflects the resonant circuit impedance and thus influences the resonant frequency of the oscillators to achieve lock-in will usually be satisfactory.

The outputs of the oscillators 11′ and 12′ are taken from the collectors of $Q_1$ and $Q_2$ respectively and applied through a decoupling resistor to the bases respectively of transistors $Q_5$ and $Q_6$. These transistors have their emitters joined and returned to ground through a self-biasing circuit and have their collectors connected through a common resistor 41 to the positive supply. The circuit associated with transistors $Q_5$ and $Q_6$ operate to vectorially add the AC input signals on the bases of the transistors to produce on the common collectors an AC signal the magnitude of which is a maximum when the oscillators 11′ and 12′ are in phase and which decreases as the phase angle increases to 90° where the output will be a minimum. This AC output from the collectors of $Q_5$ and $Q_6$ is coupled on line 42 to the detector circuit of FIG. 4 to be subsequently described.

The output of the oscillators 11' and 12' are also coupled through decoupling resistors and DC blocking capacitors to the bases of emitter follower transistors $Q_3$ and $Q_4$. The emitters of these transistors are respectively connected to terminals to which the horizontal and vertical amplifiers for the deflection plates of a cathode ray oscilloscope can be connected for indicating a Lissajou figure. The use of an oscilloscope for this purpose facilitates the initial tuning of the oscillators to have equal frequency and provides a rough indication of the phase angle between the synchronized oscillators. The oscilloscope can also be used as the AC detector 22 in FIG. 1 for visual indication of the synchronized or unsynchronized conditions.

Figure 4:
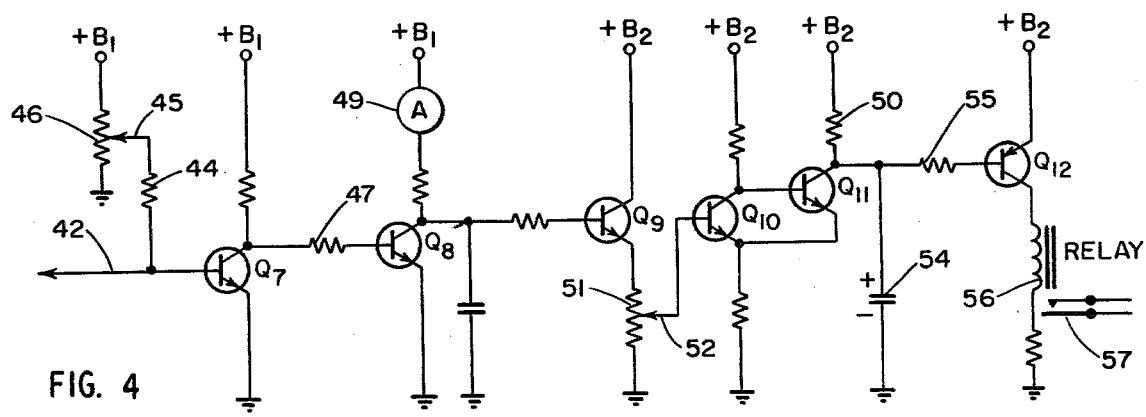
FIG. 4 is a wiring diagram of an indicator and threshold actuation circuit which can be connected to utilize the signals produced by the circuit of FIG. 3.

Referring now to FIG. 4, the detector and indicator circuits useful for static testing of discrete parts or sensing dimensions as well as dynamic sensing of anomalies in continuous parts will be described. Lead 42 is connected through a high resistor 44 to an adjustable potential determined by the position of contact 45 on a resistor 46 which is connected between the positive supply and ground. Signal lead 42 is also connected to the base of a transistor $Q_7$ which has a grounded emitter and a collector connected through a resistive load to the positive supply. The transistor $Q_7$ thus can be biased by means of adjustment 45 to operate as an amplifier for the AC wave coupled on line 42 to the base thereof and this amplified signal is coupled through a high valued resistor 47 to the base of a transistor rectifier $Q_8$. The transistor $Q_8$ has a resistor and DC micrometer connected from its collector to the positive supply and the collector is bypassed to ground. The transistor $Q_8$ thus acts as a current rectifier-amplifier for meter 49 giving decreased meter readings as the phase angle increases between the oscillators 11' and 12'.

The essentially DC signal on the collector of $Q_8$ is applied through a decoupling resistor to the base of a transistor $Q_9$ which is connected as an emitter follower with a potentiometer 51 connected between emitter and ground. The potentiometer 51 has an adjustable tap 52 which is connected to the base of a transistor $Q_{10}$. Transistor $Q_{10}$ is connected with a transistor $Q_{11}$ as a Schmitt trigger which produces an output pulse at the collector of transistor $Q_{11}$ whenever the voltage on tap 52 drops below a predetermined level established by the parameters of the Schmitt trigger circuit. Thus adjustment of tap 52 establishes the signal threshold operating point for the Schmitt trigger circuit.

A circuit for responding to the output pulse of the Schmitt trigger is connected to the collector of transistor $Q_{11}$. This circuit includes a large capacitor 54 and a coupling resistor 55 to provide with resistor 50 a time constant for maintaining the Schmitt trigger pulse as it is applied to the base of a transistor $Q_{12}$. Transistor $Q_{12}$ controls current flow to the actuation coil of a relay 56 which is thus actuated for each operation of the Schmitt trigger to control through contacts 57 any desired indicator or mechanism. Transistors $Q_9$ through $Q_{12}$, if desired, may be provided with a separate or decoupled power supply $+B_2$ as indicated.

Figure 5:
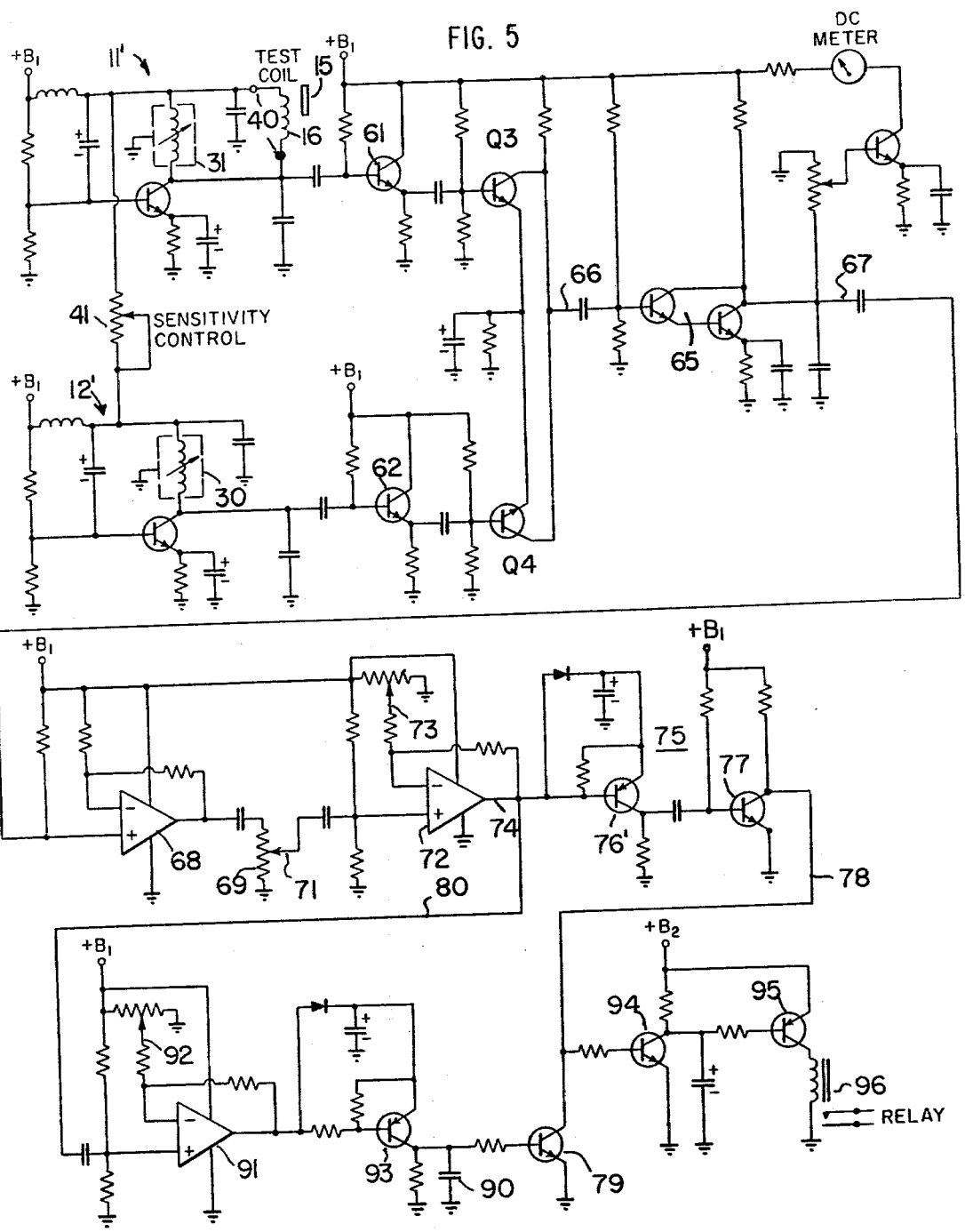
FIG. 5 is a circuit diagram of a circuit of the invention useful for checking a continuous sequence of intermittently present and absent consecutive parts.

FIG. 5 shows the details of an alternate detector circuit useful for dynamically checking a progression of discrete parts. Similar numbers will be applied to similar parts previously described. The test coil 16 is incorporated in a test oscillating circuit 11' while the reference coil 30 is incorporated in a second oscillating circuit 12'. The coupling resistor 41 is connected between the first and second oscillating circuits for bidirectional transfer of oscillatory energy between the oscillators 11', 12' to lock them in frequency synchronization while permitting relative phase change due to changes in oscillation circuit parameters. In particular, the change in inductance of test coil 16 for the presence or absence of a test part 15 in the position of maximum inductive field produces a predetermined phase change between oscillators 11', 12'. For a progression of discrete parts moving relative to test coil 16 the predetermined change is altered by an anomaly in the part, as later described, to the extent the inductive influence of the part changes the inductance or resonant parameters of coil 16 in oscillator 11'.

The outputs of oscillators 11' and 12' are coupled through emitter followers 61, 62 to the base inputs of transistors $Q_3$ and $Q_4$ which operate to add the oscillations vectorially at the predetermined phase displacement and provide at their combined output on line 66 a predetermined level AC signal at the locked oscillator frequency. This signal is applied to a Darlington transistor pair 65 which serves to detect any amplitude oscillation on the AC signal on line 66 and at the filtered output on line 67 provide the modulation envelope as the demodulation signals. Normally the locked oscillatory frequency signal on line 66 will be amplitude modulated to have a uniform amplitude modulation wave superposed thereon during the passage of a succession of good parts past test coil 16. By the action of transistor pair 65 this AC modulation signal is produced on line 67 and applied to the input of an operational amplifier 68. The operational amplifier 68 supplies an output signal to a potentiometer 69 which has an adjustable tap 71. Selection of the voltage level at tap 71 applies a signal at selected gain to an operational amplifier 72 which is biased by voltage at a selected DC level on tap 73. This bias base clips output signals on line 74 to eliminate noise.

The signals on line 74 are applied to two signal circuits. First the signals are applied to an amplifier detector circuit 75 comprising two amplifier stages 76 and 77. The signal on the collector of transistor 77 is the detected modulation pulses from all parts moving individually in sequence past the test coil 16. These signals on line 78 are normally short circuited to ground through a conducting transistor 79 as will now be described.

The signals on line 74 are applied by line 80 through an operational amplifier 91 having an adjustable bias input 92. Signals on line 80 from standard parts having sufficient amplitude to overcome the threshold bias 92 are applied to a transistor 93. The collector resistor in the output of transistor 93 has a pulse stretching capacitor 90 in parallel therewith such that the signal on line 80 is broadened to cover the time duration of signals appearing on line 78. This signal from line 80 applies a somewhat broadened pulse to the base of transistor 79 renders it conducting so as to short circuit the coincident signals on line 78 to ground. Thus no active signal is applied to the base of a relay driver transistor 94 during the passage of standard parts past test coil 16. Accordingly, the output control device such as transistor 94 and relay 96 remains deenergized.

Upon the occurrence of a part with a defect or other anomaly adequate to influence the inductance of coil 16, lower level modulation pulses appear due to the resulting phase change. When these lower level pulses occur on line 74 only the amplifier 75 reproduces them as an output on line 78 since such pulses are selected by the adjustment of bias 92 to have an amplitude lower than the threshold voltage for amplification in operational amplifier 91. Thus for defective parts producing pulses on line 78 there will be no corresponding signal output from transistor 91 and transistor 79 will be cut off permitting signals from defective parts to be applied to transistor 94, the output of which actuates relay 96. The relay 96 is connected to actuate any desired control, counting or indicating circuit.

Referring to FIGS. 6 through 11 various arrangements of the test coil 16 relative to the test piece 15 as described in FIGS. 3 and 5 will be described. While the various arrangements shown are useful in a variety of applications for performing the measurement steps necessary to practice the invention, it should be understood that the invention is not limited to the precise arrangement and disposition of coil and test piece shown in these figures, but rather that these are exemplary of typical applications.

Figure 6:
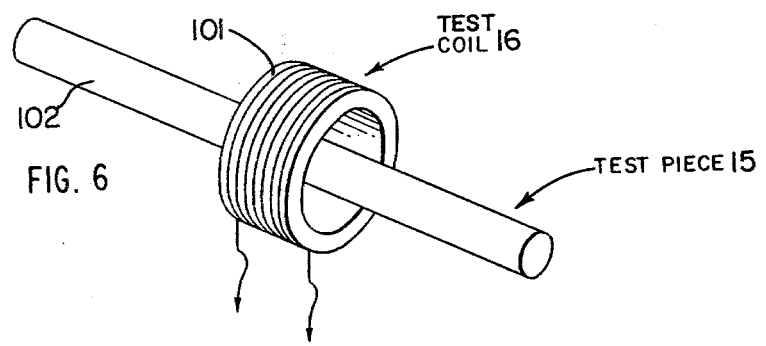
FIG. 6 is a perspective view showing a test coil and test piece arrangement useful with elongated or continuously moving test pieces.

In FIG. 6 the test coil 16 and test piece 15 are shown as respectively a solenoid coil 101 through the access of which a test piece in the form of a rod 102 is positioned. The rod or other shaped section 102 can be either stationary within the solenoid 101 and is preferably symmetrically positioned precisely on the axis of the solenoid 101. The rod 102 can be either stationary or moving as in the case of drawn wire or rolled bar stock and the supporting arrangements for the solenoid 101 and the stationary or travelling rod 102 will be such that precise positioning is maintained for test purposes. As will hereinafter appear, the arrangement of FIG. 6 can be used to detect abrupt anomalies or gradual variations in the diameter or cross-sectional dimension of the rod 102 with the appropriate circuit selected in accordance with the property it is desired to detect or measure.

Figure 7:
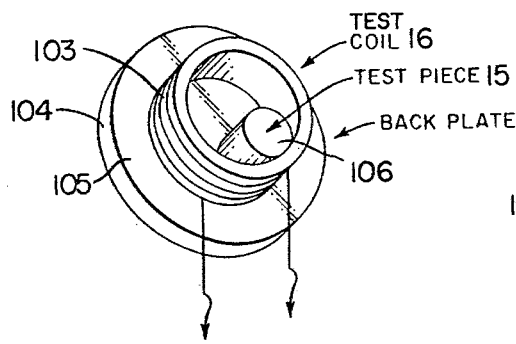
FIG. 7 is a perspective view of a test coil forming a cup for receiving and positioning by gravity a test piece relative to the test coil.

FIG. 7 shows test coil 16 and test piece 15 in the form of a solenoid 103 supported on a non-magnetic plate 104 which has an inclined surface 105 a portion of which forms a closed bottom in the solenoid 103. The axis of the solenoid 103 is normal to the inclined surface 105 and the arrangement is thus suitable for automatically positioning a test part such as a roller bearing 106 as shown in FIG. 7 (or, for example, a ball bearing not shown) in precise relation to the solenoid 103. Thus placing a part similar to a roller or ball bearing 106 within the solenoid 103 will automatically by gravity result in the part seeking its lowest position within the solenoid 103 and with the axis of the part aligned generally parallel with the axis of the solenoid 103. The arrangement of FIG. 7 is particularly suitable for go, no-go testing of parts which are successively placed with the relationship shown in the figure other shaped parts than spheres or cylinders, of course, can be tested by using appropriate arrangements or precise repetitively indentical positioning of the successively inserted parts.

Figure 8:
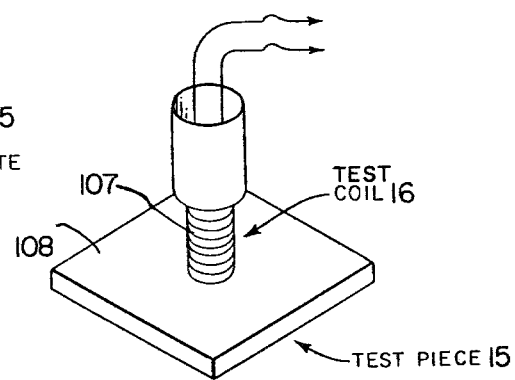
FIG. 8 is a view of a test coil in the form of a small diameter probe useful in various applications of the invention relative to various forms of test piece.

FIG. 8 shows an arrangement of test coil 16 and test piece 15 in which what is essentially a probe coil 107 is arranged either in fixed position or movable with respect to the surface 108 of test piece 15. The probe coil 107 can be, for example, a solenoid of ½ inch in diameter consisting of 700 turns of No. 36 wire for operating in an oscillator circuit 11 having an operating frequency of approximately 40 to 50 kilohertz. The solenoid 107 also preferably has a cylindrical magnetic ferrite core which extends to be flush with the end of the coil in contact with or slightly spaced from the surface 108. The transducer of FIG. 8 when employed in the circuits of the invention permits the detection of minute flaws, inclusions, indentations or surface irregularities such as bumps and furthermore will permit the sensing of the thickness of a non-conductive coating on the surface of a metallic test piece 108. Generally, since the solenoid 107 is a probe of small dimensions there will be relative movement over the surface 108 in the nature of scanning to systematically examine the surface or if anomalies are known to be present the test probe 107 can be moved in any manner.

Figure 9:
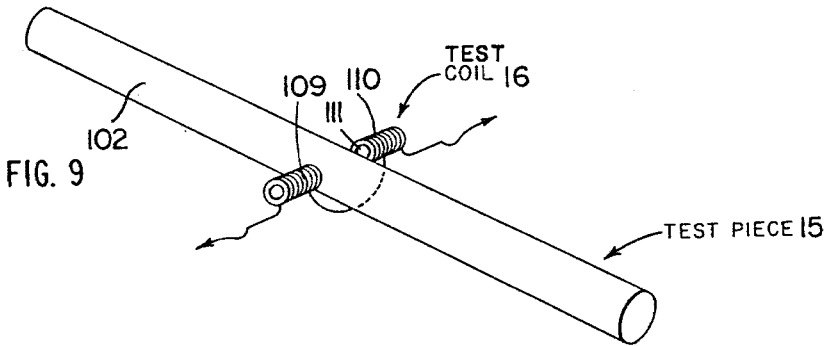
FIG. 9 is a view of test coils in relation to a test piece wherein the test coil is divided into two portions to compensate for positional variations.

FIG. 9 shows an arrangement which has features of previously described FIGS. 6 and 8. In FIG. 9 the test coil 16 comprises two aligned solenoids 109, 110 which are of the probe type generally described in FIG. 8 but disposed on opposite sides of test piece 15 which may correspond to the rod or bar 102 described in FIG. 6. Here the coils 109 and 110 are connected in series and the arrangement for positioning the rod 102 relative to the coils is such that a fixed and preferably symmetrically position therebetween is maintained. The arrangement of FIG. 9 is particularly useful where some variation in relative position is involved since the coil arrangement tends to cancel such positional variations at least to a first approximation thereby leaving the system sensitive to the anomals or dimensions under examination. As with FIG. 8 the coils 109 and 110 may be provided with ferrite cores 111. The applications of the arrangement of FIG. 9 are generally the same as those shown and described for FIG. 8.

Figure 10:
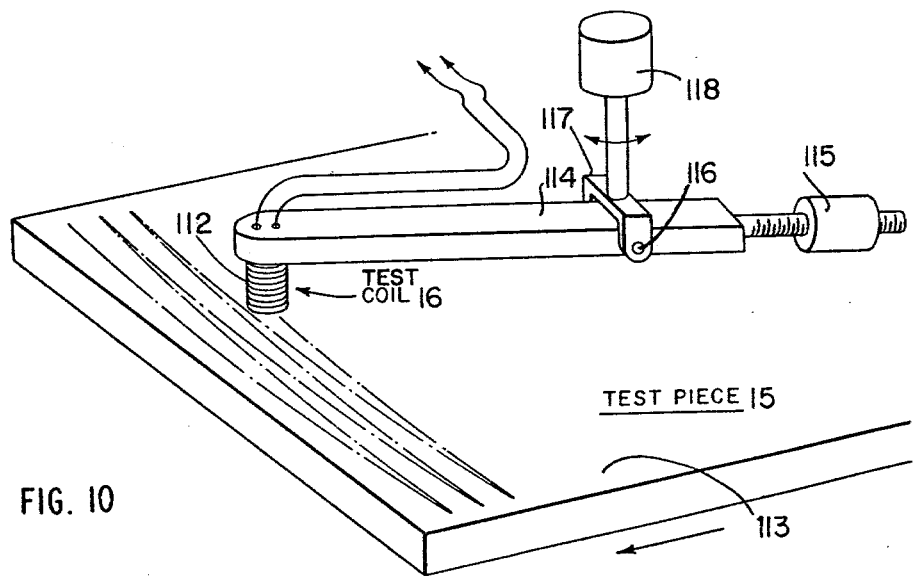
FIG. 10 is a perspective view of one form of a probe-type test coil employed in an area scanning arrangement.

FIG. 10 shows test coil 16 in the form of a probe coil 112 arranged for systematically scanning surface 113 of test piece 15. A suitable arrangement as shown would comprise a balanced arm 114 with counterweight 115 with the test coil probe 112 mounted at one end of the arm 114. The arm 114 is pivoted at 116 in a yoke 117 which is driven with oscillatory motion by a motive power device 118. If the test piece 15 is in motion relative to the probe coil 112 mounted as shown in FIG. 10, the surface 113 is systematically scanned as indicated by the traced lines shown. Any other arrangement for area scanning, of course, may be employed.

In FIG. 11 the test coil 16 comprises preferably a small diameter probe type test coil solenoid 121 positioned relative to test piece 15 where test piece 15 comprises a succession of parts such as the adjacent set of gear teeth 122, 123, 124, etc., which move relative to the probe coil 121 such that they successively influence the inductance thereof. The probe coil 121 is of such dimensions that the space between the test pieces, i.e., the space between teeth 122,123, for example, reduces or eliminates the inductive influence of the test piece 15 on the test coil 121. Any physical arrangement of the test coil and test piece can be employed such as the end on or axial arrangement shown or an arrangement (not shown) where the test coil 121 would be aligned with its axis perpendicular to the plane of the test piece 15 with the teeth 122. etc. moving progressively into position to influence the inductance of coil 121 with the spaces between teeth removing such influence. Other similar arrangements can be readily adapted by those skilled in the art to test parts of a generally similar configuration. For example, compressor and turbine blades can be tested in an arrangement similar to FIG. 11 as can be poles and slots of a rotor for an electrical machine. In an electrical machine the converse arrangement of rotating the test coil 16 relative to the starter poles and slots could also be arranged and a comparable test conducted with the arrangement of the invention. Further in an electrical machine by utilizing small test currents in the windings for the magnetic circuit small variations or defects such as shorted turns can readily be detected as the anomaly to which the circuit of FIG. 5 is adjusted to respond.

The general operation of the circuit described in FIGS. 3 and 4 now will be readily understood. As an example of its use to check metal parts relative to a standard part a description of an operating sequence will be given. First a shown good part or test piece corresponding to acceptable manufactured quality is inserted to influence the test coil 16 of oscillator 11'. The frequency of the control oscillator 12' is then adjusted using the adjustable inductor 30 to obtain lock-in with the test oscillator 11' which can be indicated, if desired, on the oscilloscope connected to transistors $Q_3$ and $Q_4$ and the phase is adjusted by tuning inductor 30 or fine tuning capacitor 38 to produce a small reading on meter 49 corresponding to an out-of-phase condition. Next a test part is substituted in the coil 16 which if it has an out-of-tolerance characteristic influences the oscillator 11'. If the reading on meter 49 decreases, the relative phase should be reversed by replacing the standard part in the coil 16 and unidirectionally adjusting inductor 30 to make the meter reading go down to zero and back up to a small meter reading. Now reinserting the out-of-tolerance test part will result in an increased meter reading. With an out-of-tolerance sample in the coil 16 the coupling resistor 41 is adjusted to increase or decrease the coupling and thus decrease or increase respectively the sensitivity of the system to establish a phase angle difference which produces a large on scale meter reading. This decreased phase angle results in an increase in the reading of meter 49. The potentiometer contact 52 is then adjusted until the Schmitt trigger operates to produce a relay actuation. The system is thus calibrated to give an indication by relay actuation whenever a similar out-of-tolerance part produces a phase deviation between the oscillations of oscillators 11' and 12' of difference magnitude and in the same sense as that produced by the test part. For parts that are within the acceptable tolerance the meter 49 will read values between the low and high values which values are an indication of the magnitude of deviation relative to the standard. This indication can also be relied upon to be sure that the system is operating and for measuring the characteristics within the acceptable tolerance limits. Upon the appearance of a defective or out-of-tolerance part in the test coil 16 the phase difference between the oscillators will be great enough to cause the measurement of such difference to produce the signal which eventually actuates the relay 56 to close the contacts 57 as previously described.

If parts are to be inspected for out-of-tolerance characteristics of the opposite sense, the calibration procedure can be repeated but with reversed phase relation and the parts then retested for this condition. If desired a calibration for a standard part could be set at mid-range on the meter 49 and plus or minus tolerance be detected as preselected plus or minus increments of the meter reading and to actuate an indicator.

By adjusting the mutual coupling 41 a selected sensitivity as indicated by characteristics 23 and 24 in FIG. 2B can be selected, and by calibrating the meter 49 deviations within this range can be measured. By selecting some point within this range such as is determined by the threshold for the trigger circuit in FIG. 4, a go-, no-go test at a desired tolerance can be conducted. For very sensitive measurements where a low degree of coupling is provided by the impedance 41 it may be necessary to utilize the trimming adjustment 38 to bring the oscillators 11' and 12' into the desired phase relationship so that the low level interaction therebetween can be effective to provide a sensitive range of locked-in operation. Under this condition it may be useful to detect a tolerance limit when the oscillators fall out of synchronization and for this purpose the detection of a frequency difference between the two oscillators such as by use of AC detector 22 shown in FIG. 1 may be used to give this indication. For less sensitive measurements this frequency difference detector can be used to indicate large deviations which produce loss of synchronization.

Because of the range of sensitivities provided by the present invention a wide range of measurements can be made. Thus changes in mass and dimension are readily detected as well as the presence of flaws such as microscopic cracks or the like. The instrument is also sensitive to the composition of material of which the part is made and can detect differences in conductivity such as those which occur in certain materials due to heat treatment. For such materials the invention can detect the degree of heat treatment. Any conductive medium can be tested and the apparatus calibrated to detect any selected change in conductivity from a standard value.

Referring now to FIG. 11, the operation of the circuit of FIG. 5 will be briefly described to emphasize the previously described operating conditions. Oscillators 11', 12' are tuned to operate at approximately the same frequency and lock-in occurs by virtue of the bidirectional energy transfer between the oscillators provided by coupling represented as resistor 41. Other forms of energy coupling between the oscillators are, of course, possible. The outputs from the two oscillators are in frequency synchronization but their phase displacement is determined by the resonant parameters of the respective oscillators and these parameters for oscillator 11' vary between predetermined limits depending upon the presence or absence of a test part 15 at a relative maximum field position for test coil 16. Thus a sequence of good test parts produces a modulation due to the phase shift between oscillators 11' and 12' as the test parts pass the test coil 16. This modulation of the oscillator frequency is shown in waveform A of FIG. 12 as the large amplitude pulses 120. When an out-of-tolerance part or a part having an anomaly passes the coil 16 the modulation is reduced as indicated by pulse 121.

The output on line 66 of the $Q_3$, $Q_4$ circuit which adds the outputs of oscillators 11' and 12' appears as the modulation envelope waveform A. The different amplitude signal levels between pulse 120 and pulse 121 are preserved in the detector 65 and the outut is filtered to remove the carrier frequency component provided by the oscillators. The waveform A thus derived is shaped and the amplitude difference accentuated by the operational amplifiers 68, 72 which provide on output line 74 the waveform B of FIG. 12. Adjustment of the bias control 92 permits selection of the amplitude of standard ("good") parts relative to that of out of tolerance parts to pass through operational amplifier 91 and control conductivity of transistor 79 via transistor 93. Waveform C shows the output of amplifier 91 which waveform D shows the result of limiting and pulse stretching in transistor 93 and circuit 94.

The signal B on line 74 proceeds to amplifier circuit 75 to produce on line 78 saturated pulses corresponding to both pulses 120 and 121. The waveform D operates transistor 79 only in response to standard part pulses 120 since the lower amplitude pulses 121 are blocked by the bias setting 92. The broadened pulses D shown in FIG. 12 render transistor 79 conductive and short circuit signals from pulses 120 on line 78 to ground so that no signal component is applied to the base of transistor 94. For an out-of-tolerance signal pulse 121 waveform D permits transistor 79 to remain cutoff and the corresponding pulse signal component on line 78 is applied as a pulse E to trigger the transistors 94, 95 and actuate relay 96.

The disclosed circuit arrangements and structure for sensing parts and anomalies therein or gauging properties thereof provides for a wide variety of application of the invention. Such applications can be classified broadly as I static and II dynamic with reference to the relative motion between the transducer or test coil 16 and the part being examined. Subdivisions under each major category include A discrete parts and B continuous parts. Under category IA discrete parts can be tested on a go, no-go basis with the part positioned in the stationary location in the test coil using the circuits of FIGS. 3 and 4. Similarly, a continuous part in category IB can be tested for slowly developing changes in the property being monitored using the circuits of FIGS. 3 and 4. For example, the dimensions of the rod 102 in FIGS. 6 and 9 can be measured and an indicator circuit actuated if the dimension gradually drifts out of tolerance. Thus this is considered a static measurement because of the slow change of the property producing the signal even though the rod 102 may be passing at high speed through the transducer. The same considerations would apply to an application such as shown in FIG. 8 where the thickness of a surface coating on the surface 108 is measured and a gradual change in thickness would be indicated when it reached a predetermined level. Similarly, the detection of flaws in a part using the transducer of FIG. 7 would be essentially a DC measurement when the part was at rest in the predetermined position of the coil.

Category IIA for the dynamic checking of discrete parts applied primarily to sensing a moving progession of parts such as items on an assembly line or analogous arrangement where a repeatedly appears and disappears within the field of the test coil 16. Such an arrangement is specifically represented in the transducer test piece arrangements of FIG. 11 and corresponds generally with the test coil 107 of FIG. 8 arranged to examine individual parts such as the knitting needles in applicant's copending application Ser. No. 571,949 now U.S. Pat. No. 3,987,649. Here the circuit of FIG. 5 is required to prevent the actuation of the relay for the rapid alternate succession of the presence and absence of a part in the field of the test coil and only producing a response when an anomalous test part appears in the sequence. The continuous high-speed checking of moving parts under category IIB can be accomplished with the circuit of FIG. 4 adapted to have its time constants respond to abrupt changes as an anomaly passes a transducer thereby indicating occurrence of such event and actuating a stop motion or other control device as desired.

The application of the present invention is extremely broad and includes, without being limited to, the following categories:

1. Hardness testing of heat-treated parts. The circuit is capable of readily detecting changes of plus or minus 5 on the Rockwell C scale of hardness using any of the test set-ups IA, IB, IIA, IIB.

2. The size of parts can readily be determined either as a calibrated measurement or deviation from a standard to within 0.0005 inches provided that the part is accurately located relative to the transducer or used wih a location compensating transducer.

3. The cross-sectional shape of parts can be measured within 0.0005 inches with respect to the distance between the coil and the surface of the part again using accurately located part and transducer arrangements or location compensated transducers.

4. Surface and sub-surface flaws can be detected in any of the disclosed arrangements such as hair-line cracks both surface and sub-surface and the inclusion or occlusion type anomaly. For example, a 0.020 diameter steel ball embedded at a depth $\frac{1}{8}$th inch in a dielectric can readily be detected with the arrangement of FIG. 8 and a similar size hole within a conductive titanium plate at a depth of $\frac{1}{8}$th inch can also be detected.

5. The composition of the part can be detected particularly the deviation in composition from a standard part. For example, the difference between 20 and 25 carbon steel and between numbers 306 and 316 stainless steel can readily be detected. Obviously, such gross differences in composition as the difference between ferrous and non-ferrous metals will readily be detectable.

6. The density of parts such as those made of powdered and sintered metal and deviations from a standard part are readily detectable.

The various categories of measurement such as items 1–6 above can readily be monitored or measured as the properties in the arrangements of encounters between the test piece and transducer as indicated in categories IA, IB, IIA and IIB and such arrangements will now be clear to those skilled in the art in light of the present disclosures.

Many modifications may be made in the invention and will occur to those skilled in the art in light of the present teaching. The invention, accordingly, is not to be considered as limited to the specific embodiment disclosed but only by the scope of the appended claim.

I claim:

1. The method of testing metal parts for incremental variation in one or more of the properties of size or shape, mass, voids, composition or hardness comprising the steps of:

coupling oscillatory energy between two like tuned oscillators to synchronize said oscillators in frequency with the phase angle between the like frequency oscillations determined as a function of the tuning of said oscillators;

bringing parts subject to incremental variation in one of said properties into regularly ordered association with one of said oscillators so as to influence the tuning thereof, said influence being invariant for said association of parts having no incremental variation of said properties;

establishing a predetermined phase angle between said oscillators for the condition of tuning influenced by a part having no incremental variation of said properties;

detecting a signal which varies in accordance with the phase angle between said oscillators;

discriminating between detected signals representing phase angle variation caused by said bringing parts into regularly ordered association with one of said oscillators from signals caused by said incremental variation; and utilizing said detected signals after said discriminating as an indicator of absence or presence of said incremental variation in said one property.

* * * * *